(12) United States Patent
Kataigi et al.

(10) Patent No.: US 9,165,813 B2
(45) Date of Patent: Oct. 20, 2015

(54) SEMICONDUCTOR MANUFACTURING APPARATUS MEMBER

(71) Applicant: NGK INSULATORS, LTD., Nagoya (JP)

(72) Inventors: Takashi Kataigi, Handa (JP); Takashi Tanimura, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 199 days.

(21) Appl. No.: 13/869,441

(22) Filed: Apr. 24, 2013

(65) Prior Publication Data

US 2013/0286532 A1 Oct. 31, 2013

Related U.S. Application Data

(60) Provisional application No. 61/639,207, filed on Apr. 27, 2012.

(51) Int. Cl.
*H01L 21/683* (2006.01)
*H01L 21/67* (2006.01)
*H01L 21/687* (2006.01)

(52) U.S. Cl.
CPC ...... *H01L 21/6833* (2013.01); *H01L 21/67109* (2013.01); *H01L 21/6875* (2013.01)

(58) Field of Classification Search
CPC ................ H01L 21/67109; H01L 21/6833; H01L 21/6875
USPC .......................................................... 361/234
See application file for complete search history.

(56) References Cited

U.S. PATENT DOCUMENTS

| | | | |
|---|---|---|---|
| 6,471,779 B1 | 10/2002 | Nishio et al. | |
| 6,490,145 B1 * | 12/2002 | Kholodenko et al. | 361/234 |
| 7,619,870 B2 * | 11/2009 | Himori et al. | 361/234 |
| 2009/0230636 A1 * | 9/2009 | Goto | 279/128 |

FOREIGN PATENT DOCUMENTS

JP 2000-315680 A1 11/2000

* cited by examiner

*Primary Examiner* — Thienvu Tran
*Assistant Examiner* — Kevin J Comber
(74) *Attorney, Agent, or Firm* — Burr & Brown, PLLC

(57) ABSTRACT

In a semiconductor manufacturing apparatus member, paths that may become a discharge path between a wafer and a cooling device are a first path and a second path. The first path is the shortest path from a hole to a hole across a plug. The length of the first path is larger than the thickness of the plug. The second path is the shortest path that extends from one of holes to an outer peripheral surface of the plug along an adhesive layer, and the shortest path from a hole in a bonding sheet to the outer peripheral surface of the plug along the bonding sheet. The sum of the lengths of these respective paths is larger than the thickness of the plug.

3 Claims, 3 Drawing Sheets

FIG. 3

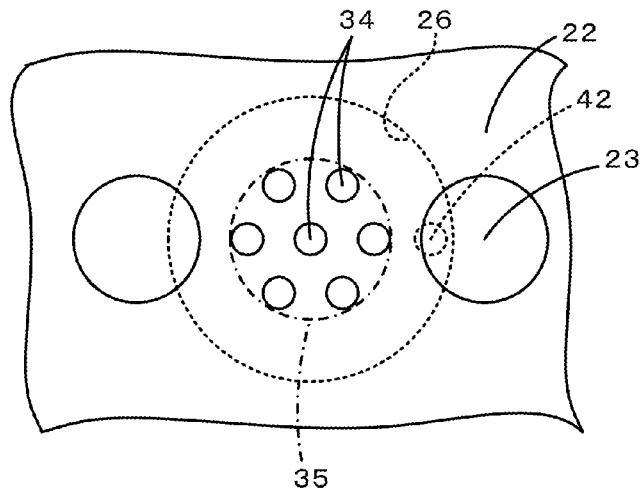

FIG. 4

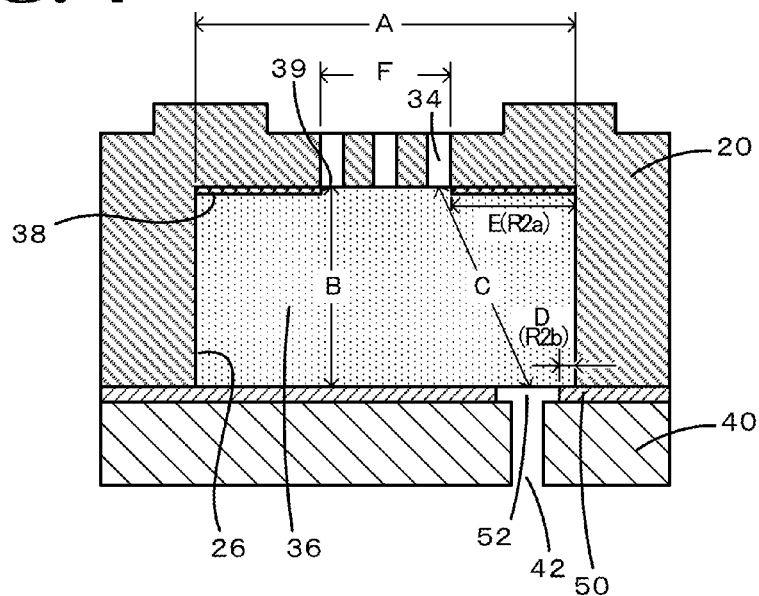

| |
|---|
| A : DIAMETER OF AIR PERMEABLE PLUG 36 (SUBSTANTIALLY SAME LENGTH OF DIAMETER OF NON-THROUGH HOLE 26) |
| B : THICKNESS OF AIR PERMEABLE PLUG 36 (SUBSTANTIALLY SAME LENGTH OF DEPTH OF NON-THROUGH HOLE 26) |
| C : DISTANCE BETWEEN HOLES (LENGTH OF FIRST PATH R1) |
| D : SHORTEST DISTANCE FROM EDGE OF THROUGH HOLE 52 IN BONDING SHEET 50 TO OUTER PERIPHERAL SURFACE OF AIR PERMEABLE PLUG 36 (LENGTH OF SHEET-SIDE PORTION R2b) |
| E : SHORTEST DISTANCE FROM EDGE OF CIRCULAR THROUGH HOLE 39 IN ADHESIVE LAYER 38 TO OUTER PERIPHERAL SURFACE OF AIR PERMEABLE PLUG 36 (LENGTH OF ADHESIVE-LAYER-SIDE PORTION R2a) |

SEMICONDUCTOR MANUFACTURING APPARATUS MEMBER

BACKGROUND OF THE INVENTION

1. Field of the Invention

The present invention relates to a semiconductor manufacturing apparatus member.

2. Description of Related Art

To date, semiconductor manufacturing apparatus members in which an electrostatic chuck having a wafer placement surface is disposed on a cooling device have been known. In some of such semiconductor manufacturing apparatus members, a backside gas such as helium (He) is supplied to the back surface of a wafer placed on the electrostatic chuck in order to dissipate heat from the wafer. Some of such semiconductor manufacturing apparatus members include a gas supply hole that extends through the cooling device from a joint surface of the cooling device that is joined to the electrostatic chuck to a surface of the cooling device that is opposite to the joint surface, a non-through hole that is formed in the electrostatic chuck from a surface of the electrostatic chuck that faces the gas supply hole toward the wafer placement surface, a narrow hole that extends through the electrostatic chuck from a bottom surface of the non-through hole to the wafer placement surface, and an air permeable plug that is fitted into the non-through hole (see, for example, Patent Literature 1).

[PTL 1] JP 2000-315680 A

SUMMARY OF INVENTION

In recent years, in order to facilitate heat transfer from an electrostatic chuck to a cooling device, the thickness of the electrostatic chuck has been reduced.

As a result, with existing semiconductor manufacturing apparatus members, the distance between the cooling device and a wafer that is placed on the placement surface is reduced, and hence dielectric breakdown between the cooling device and the wafer may occur. In particular, it has been found that, when the thickness of the electrostatic chuck is as small as about 1.5 mm, discharge along a straight line connecting the gas supply hole and the narrow hole (in-plug discharge) is more likely to occur than discharge along an insulated portion from the wafer to the cooling device (surface creepage). Moreover, it has been found that, when the plasma power is high, the potential difference between the wafer and the cooling device is increased, and in-plug discharge is more likely to occur. When discharge occurs, a discharge crater may be formed on the wafer, particles and the like may be generated, and a circuit on the wafer may be destroyed.

Accordingly, it is an object of the present invention to increase the withstand voltage of a semiconductor manufacturing apparatus member.

According to the present invention, there is provided a semiconductor manufacturing apparatus member in which an electrostatic chuck having a wafer placement surface is disposed on a cooling device. The member includes a gas supply hole that extends through the cooling device from a joint surface of the cooling device that is joined to the electrostatic chuck to a surface of the cooling device that is opposite to the joint surface; an insulating bonding sheet that is disposed between the electrostatic chuck and the cooling device, the bonding sheet having a through hole at a position facing the gas supply hole; a recessed portion that is formed in the electrostatic chuck from a surface of the electrostatic chuck that faces the gas supply hole toward the wafer placement surface, the recessed portion being connected to the gas supply hole; a narrow hole that extends through the electrostatic chuck from a bottom surface of the recessed portion to the wafer placement surface; an air permeable plug that is made of an insulating material and that is fitted into the recessed portion; and an insulating adhesive layer that is disposed between the bottom surface of the recessed portion and the air permeable plug, the adhesive layer having a through hole at a position facing the narrow hole. The shortest distance from the narrow hole to the gas supply hole across the air permeable plug is larger than a thickness of the air permeable plug. The sum of the shortest distance from an edge of the through-hole in the adhesive layer to an outer peripheral surface of the air permeable plug along the adhesive layer and the shortest distance from the outer peripheral surface of the air permeable plug to an edge of the through hole in the bonding sheet along the bonding sheet is also larger than the thickness of the air permeable plug.

In the semiconductor manufacturing apparatus member according to the present invention, paths that may become a discharge path between a wafer placed on the wafer placement surface and the cooling device are the shortest path (referred to as a "first path") from a narrow hole to the gas supply hole across the air permeable plug and a path (referred to as a "second path") that extends from a narrow hole to an outer peripheral surface of the air permeable plug along the adhesive layer along the shortest path, then to the bonding sheet along the outer peripheral surface, and to the gas supply hole along the bonding sheet along the shortest path. Here, a case where the first path extends in the thickness direction of the air permeable plug is considered as a comparative reference. In the comparative reference, the length of the first path is equal to the thickness of the air permeable plug. In contrast, the length of the first path in the present embodiment is larger than that in the comparative reference. Therefore, the withstand voltage of the present embodiment is higher than that of the comparative reference. In the present invention, portions of the second path that contribute to the withstand voltage are those that are electrically insulated. These portions are the shortest path (referred to as an "adhesive-layer-side portion) from an edge of the through hole in the adhesive layer to an outer peripheral surface of the air permeable plug along the adhesive layer, and the shortest path (referred to as a "sheet-side portion") from the outer peripheral surface of the air permeable plug to an edge of the through hole in the bonding sheet along the bonding sheet. Because there is a very small gap between the outer peripheral surface of the air permeable plug and the inner peripheral surface of the non-through hole, it is assumed that the outer peripheral surface of the air permeable plug is not electrically insulated. In the present invention, the sum of the length of the adhesive-layer-side portion and the length of the sheet-side portion is larger than the length of the first path of the comparative reference. Therefore, the withstand voltage of the present embodiment is higher than that of the comparative reference. That is, along whichever of the first and second paths discharge may occur, the withstand voltage of the present embodiment is higher than that of the comparative reference.

In the semiconductor manufacturing apparatus member according to the present invention, the narrow hole may be provided in a plurality, the through hole in the adhesive layer may be formed at a position facing the plurality of narrow holes, and the shortest distance from one of the narrow holes that is nearest to the gas supply hole to the gas supply hole across the air permeable plug may be larger than the thickness of the air permeable plug. In this case, because there are a plurality of narrow holes, gas can be more evenly supplied to the entire back surface of the wafer than in a case where there is only one narrow hole.

In such a structure, the plurality of narrow holes may be formed in a circular region having a predetermined radius from the center of the recessed portion. In this case, the length of the adhesive-layer-side portion of the second path can be easily increased.

BRIEF DESCRIPTION OF DRAWINGS

FIG. 3 is a (partial) plan view of the semiconductor manufacturing apparatus member 10.

FIG. 4 shows the dimensions A to E.

DETAILED DESCRIPTION OF THE INVENTION

Figure 1:
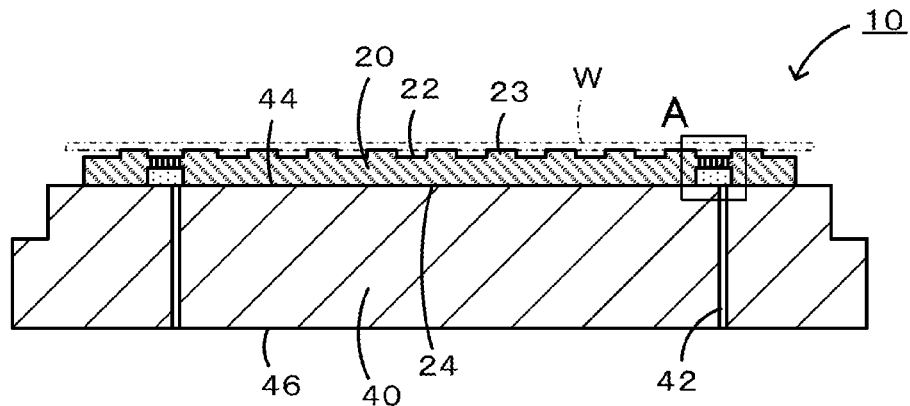
FIG. 1 is a longitudinal sectional view of a semiconductor manufacturing apparatus member 10.
Figure 2:
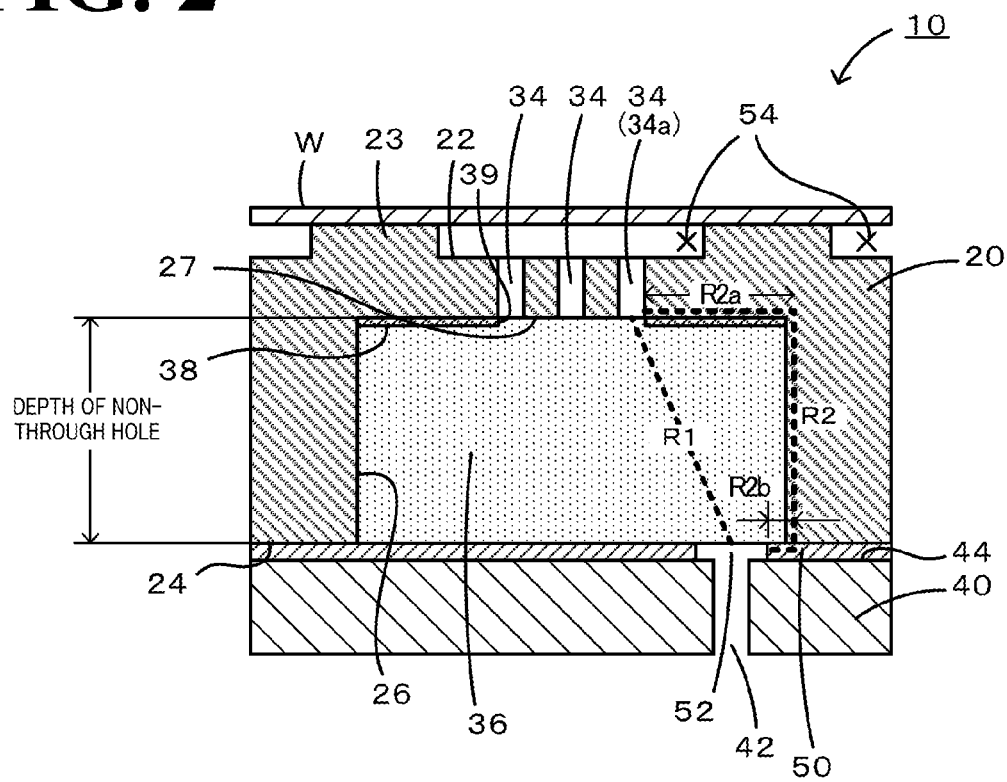
FIG. 2 is an enlarged view of a region A of FIG. 1.

Hereinafter, an embodiment of the present invention will be described with reference to the drawings. FIG. 1 is a longitudinal sectional view of a semiconductor manufacturing apparatus member 10, FIG. 2 is an enlarged view of a region A of FIG. 1, and FIG. 3 is a (partial) plan view of the semiconductor manufacturing apparatus member 10.

The semiconductor manufacturing apparatus member 10 is a member in which an electrostatic chuck 20 having a wafer placement surface 22 is disposed on a cooling device 40. A plurality of embossed portions (small protrusions) 23 are formed on the wafer placement surface 22. A wafer W, which is to be subjected to plasma processing, is placed on the embossed portions 23.

The cooling device 40 is a disk-shaped member made of a metal, such as aluminum. The cooling device 40 has a gas supply hole 42. The gas supply hole 42 extends through the cooling device 40 from a joint surface 44 of the cooling device 40 that is joined to the electrostatic chuck 20 to a surface 46 that is apposite to the joint surface 44.

The electrostatic chuck 20 is a high-density disk-shaped member made of a ceramic, such as alumina. The electrostatic chuck 20 has a non-through hole (recess) 26 and a plurality of narrow holes 34 that are connected to the non-through hole 26. The non-through hole 26 is formed in the electrostatic chuck 26 from a surface 24, which is a surface of the electrostatic chuck 20 that is opposite to the wafer placement surface 22, toward the wafer placement surface 22. The non-through hole 26 is formed at a position facing the gas supply hole 42. Therefore, the non-through hole 26 is connected to the gas supply hole 42. A space inside the non-through hole 26 has a cylindrical shape. The narrow holes 34 each have a diameter smaller than that of the non-through hole 26 and extend through the electrostatic chuck 20 from a bottom surface 27 of the non-through hole 26 to the wafer placement surface 22. The narrow holes 34 have openings in a portion of the wafer placement surface 22 on which the embossed portions 23 are not formed. Plural (for example, seven) narrow holes 34 are formed for each non-through hole 26. An air permeable plug 36, which is made of an insulating material, is fitted into the non-through hole 26. The air permeable plug 36 is bonded, through an insulating adhesive layer 38, to a portion of the bottom surface 27 of the non-through hole 26 in which the narrow holes 34 are not formed. The adhesive layer 38 has a size with which the adhesive layer 38 can cover the surface of the air permeable plug 36. A circular through hole 39 is formed in the adhesive layer 38 at a position facing the narrow holes 34. The air permeable plug 36 may be made by compacting particles of an insulating ceramic using an inorganic adhesive so as to be air permeable. Alternatively, the air permeable plug 36 may be made from a porous ceramic body. Further alternatively, the air permeable plug 36 may be made from glass fiber or a heat-resistant Teflon sponge. It is preferable that the air permeable plug 36 be made from a porous ceramic body, because it is easy to form very small narrow holes. As the adhesive layer 38, a silicone sheet or a polyimide adhesive, for example, may be used.

The narrow holes 34 are formed at the central position and around the central position of the non-through hole 26. The gas supply hole 42 is formed at a position separated from the central position of the non-through hole 26. As illustrated in FIG. 3, the narrow holes 34 are formed in a circular region 35 having a predetermined radius from the center of the bottom surface 27 of the non-through hole 26. The predetermined diameter may be smaller than the radius of the non-through hole 26, and may be, for example, in the range of $1/10$ to $1/2$ times the radius of the non-through hole 26.

The cooling device 40 is joined to the electrostatic chuck 20 through an insulating bonding sheet 50. A through hole 52 is formed in a portion of the bonding sheet 50 that faces the gas supply hole 42.

In the semiconductor manufacturing apparatus member 10, paths that may become a discharge path between a wafer W placed on the wafer placement surface 22 and the cooling device 40 are a first path R1 and a second path R2. In FIG. 2, the first and second paths R1 and R2 are shown by dotted lines. To be specific, the first path R1 is the shortest path from a narrow hole 34a, which is one of the narrow holes 34 that is nearest to the gas supply hole 42, to the gas supply hole 42 across the air permeable plug 36. The second path R2 is a path that extends from one of the narrow holes 34 to an outer peripheral surface of the air permeable plug 36 along the adhesive layer 38 along the shortest path, then to the bonding sheet 50 along the outer peripheral surface, and to the gas supply hole 42 along the bonding sheet 50 along the shortest path. In the present embodiment, the length of the first path R1 is larger than the thickness of the air permeable plug 36. Portions of the second path R2 that contribute to the withstand voltage are those that are electrically insulated. These portions are the shortest path (adhesive-layer-side portion R2a) from an edge of the through hole 39 in the adhesive layer 38 to an outer peripheral surface of the air permeable plug 36 along the adhesive layer 38, and the shortest path (sheet-side portion R2b) from the outer peripheral surface of the air permeable plug 36 to an edge of the through hole 52 in the bonding sheet 50 along the bonding sheet 50. Because there is a very small gap between the outer peripheral surface of the air permeable plug 36 and the inner peripheral surface of the non-through hole 26, it is assumed that the outer peripheral surface of the air permeable plug 36 is not electrically insulated. In the present embodiment, the sum (R2a+R2b) of the length of the adhesive-layer-side portion R2a and the length of the sheet-side portion R2b is larger than the thickness of the air permeable plug 36.

The semiconductor manufacturing apparatus member 10 is installed in a chamber (not shown). A wafer W is placed on the wafer placement surface 22, a material gas is introduced into the chamber, an RF voltage for generating plasma is applied to the cooling device 40, and the wafer W is processed using generated plasma. At this time, a backside gas, such as helium, is introduced into the gas supply hole 42 from a gas cylinder (not shown). The backside gas is supplied to a space 54 on the back side of the wafer W through the gas supply hole 42, the air permeable plug 36 in the non-through hole 26, and the narrow holes 34.

While plasma is being generated, discharge between the wafer W and the cooling device 40 may occur. As described above with reference to FIG. 2, discharge may occur along the first path R1 or the second path R2. Here, a case where a line segment connecting the narrow hole to the gas supply hole extends in the thickness direction of the air permeable plug 36 is considered as a comparative reference (see a comparative example 1 in Table 2). In the comparative reference, the length of the first path R1 is equal to the thickness of the air permeable plug 36. In contrast, in the present embodiment, the length of the first path R1 is larger than the thickness of the air permeable plug 36. Therefore, the withstand voltage of the present embodiment is higher than that of the comparative reference. As described above, portions of the second path R2 that contribute to the withstand voltage are the adhesive-layer-side portion R2a and the sheet-side portion R2b. In the present embodiment, the sum of the length of the adhesive-layer-side portion R2a and the length of the sheet-side portion R2b is larger than the thickness of the air permeable plug 36, and therefore the withstand voltage of the present embodiment is higher than that of the comparative reference. That is, along whichever of the first and second paths R1 and R2 discharge may occur, the withstand voltage of the present embodiment is higher than that of the comparative reference.

If one of the length of the first path R1 and the sum of the length of the adhesive-layer-side portion R2a and the length of the sheet-side portion R2b of the second path R2 is smaller than the thickness of the air permeable plug 36, the withstand voltage is not higher than that of the comparative reference for the following reason. If, for example, the length of the first path R1 is equal to the thickness of the air permeable plug 36, discharge is more likely to occur along the first path R1, even when the sum of the length of the portion R2a and the length of the portion R2b is larger than the thickness of the air permeable plug 36. If the sum of the aforementioned lengths is smaller than or equal to the thickness of the air permeable plug 36, discharge is more likely to occur along the second path R2, even when the length of the first path R1 is larger than the thickness of the air permeable plug 36.

With the semiconductor manufacturing apparatus member 10 according to the present embodiment described above, the withstand voltage between the wafer W and the cooling device 40 can be increased. Because there are plural narrow holes 34, the backside gas can be more evenly supplied to the entire back surface of the wafer W than in a case where there is only one narrow hole 34. Moreover, because the narrow holes 34 are disposed in the circular region 35 having a predetermined radius from the center of the bottom surface 27 of the non-through hole 26, the length of the adhesive-layer-side portion R2a of the second path R2 can be easily increased, and therefore it is easy to make the sum of the aforementioned lengths (Ra+R2b) be larger than the thickness of the air permeable plug 36.

The present invention is not limited to the embodiment described above and can be modified in various ways within the scope of the present invention.

For example, in the embodiment described above, the center of the circular region 35, in which the narrow holes 34 are disposed, is the same as the center of the bottom surface 27 of the non-through hole 26. Alternatively, the center of the circular region 35 may be displaced from the center of the bottom surface 27 of the non-through hole 26. In the embodiment, the center of the gas supply hole 42 is displaced from the center of the non-through hole 26. Alternatively, the center of the gas supply hole 42 may be the same as the center of the non-through hole 26. Further alternatively, the circular region 35 may be disregarded, and the narrow holes 34 may be formed in the wafer placement surface 22 so as to be evenly distributed in a portion of the wafer placement surface 22 on which the embossed portions 23 are not formed. When any of these alternatives is used, it is necessary that the length of the first path R1 be larger than the thickness of the air permeable plug 36 and the sum of the length of the adhesive-layer-side portion R2a and the length of the sheet-side portion R2b be larger than the thickness of the air permeable plug 36.

In the embodiment described above, there are plural narrow holes 34. Alternatively, there may be only one narrow hole 34. In this case, although it is difficult to evenly supply the backside gas to the entire back surface of the wafer W as compared with the embodiment described above, an effect of increasing the withstand voltage between the wafer W and the cooling device 40 can be obtained.

EXAMPLES

Examples 1 to 3 of the semiconductor manufacturing apparatus member 10 were made so as to have dimensions shown in Table 1. Comparative examples 1 to 3 of a semiconductor manufacturing apparatus member were made so as to have dimensions shown in Table 2. The definitions of the dimensions A to E in Tables 1 and 2 are shown in FIG. 4. In the examples 1 to 3, each of the dimension C and the dimension (D+E) were larger than the dimension B (the thickness of the air permeable plug 36). In the comparative example 1, the gas supply hole 42 was disposed at the central position of the non-through hole 26. In the comparative example 1, the dimension (D+E) was larger than the dimension B, and the dimension C was equal to the dimension B. In the comparative example 2, the center of the circular region 35, in which the narrow holes 34 were disposed, was displaced from the center of the non-through hole 26 in a direction away from the gas supply hole 42. In the comparative example 2, the dimension C was larger than the dimension B, and the dimension (D+E) was smaller than the dimension B. In the comparative example 3, the adhesive layer 38 was omitted. In the comparative example 3, the dimension C was larger than the dimension B, and the dimension (D+E) was smaller than the dimension B. In each of the examples 1 to 3 and the comparative examples 1 to 3, the electrostatic chuck 20 was made of dense aluminum nitride, the cooling device 40 was made of aluminum, and the air permeable plug 36 was made of porous alumina.

TABLE 1

|  |  | EXAMPLE 1 | EXAMPLE 2 | EXAMPLE 3 |
|---|---|---|---|---|
| Structure (Cross Section) | | | | |
| Dimension A | | 7 | 5 | 7 |
| Dimension B | | 1.1 | 1.1 | 1.1 |
| Dimension C | | 2.7 | 1.9 | 2.5 |
| Dimension D | | 0.5 | 0.5 | 0.5 |
| Dimension E | | 3.0 | 2.0 | 2.0 |
| Dimension (D + E) | | 3.5 | 2.5 | 2.5 |
| Diameter of Gas Supply Hole (mm) | | 0.5 | 0.5 | 0.5 |
| Position of Gas Supply Hole | | Edge (3 mm Apart from Center) | Edge (2 mm Apart from Center) | Edge (3 mm Apart from Center) |
| Diameter of Narrow Hole (mm) | | 0.1 | 0.1 | 0.1 |
| Position of Narrow Hole | | Center | Center | Center |
| Thickness of Electricstatic Chuck (mm) | | 1.5 | 1.5 | 1.5 |
| Diameter of Non-through Hole (mm) | | 7 | 5 | 7 |
| Adheive Layer between Plug and Chuck | | Silicone Sheet | Silicone Sheet | Silicone Sheet |
| Diameter of Through Hole in Boding Sheet (mm) | | 1 | 1 | 1 |
| Position of Through Hole in Boding Sheet | | Edge (3 mm Apart from Center) | Edge (3 mm Apart from Center) | Edge (3 mm Apart from Center) |
| Withstand Voltage (kV) | 1st | 3.0 | 1.9 | 2.6 |
| | 2nd | 2.9 | 1.8 | 2.6 |
| | 3rd | 3.3 | 2.2 | 2.7 |
| | Average | 3.1 | 2.0 | 2.6 |

TABLE 2

|  | COMPARATIVE EXAMPLE 1 | COMPARATIVE EXAMPLE 2 | COMPARATIVE EXAMPLE 3 |
|---|---|---|---|
| Structure (Cross Section) | | | |
| Dimension A | 7 | 7 | 7 |
| Dimension B | 1.1 | 1.1 | 1.1 |
| Dimension C | 1.1 | 6.1 | 2.3 |
| Dimension D | 3.0 | 0.5 | 0.5 |
| Dimension E | 3.0 | 0.5 | 0.0 |
| Dimension (D + E) | 6.0 | 1.0 | 0.5 |
| Diameter of Gas Supply Hole (mm) | 0.5 | 0.5 | 0.5 |
| Position of Gas Supply Hole | Center | Edge (3 mm Apart | Edge (3 mm Apart |

TABLE 2-continued

| | | | from Center) | from Center) |
|---|---|---|---|---|
| Diameter of Narrow Hole (mm) | | | 0.1 | 0.1 | 0.1 |
| Position of Narrow Hole | | | Center | Edge (3 mm Apart from Center) | Center |
| Thickness of Electricstatic Chuck (mm) | | | 1.5 | 1.5 | 1.5 |
| Diameter of Non-through Hole (mm) | | | 7 | 7 | 7 |
| Adheive Layer between Plug and Chuck | | | Silicone Sheet | Silicone Sheet | None |
| Diameter of Through Hole in Boding Sheet (mm) | | | 1 | 1 | 1 |
| Position of Through Hole in Boding Sheet | | | Center | Edge (3 mm Apart from Center) | Edge (3 mm Apart from Center) |
| Withstand Voltage (kV) | 1st | | 0.9 | 0.7 | 0.7 |
| | 2nd | | 0.9 | 0.8 | 0.5 |
| | 3rd | | 0.8 | 1.0 | 0.5 |
| | Average | | 0.9 | 0.8 | 0.6 |

Figure 5:
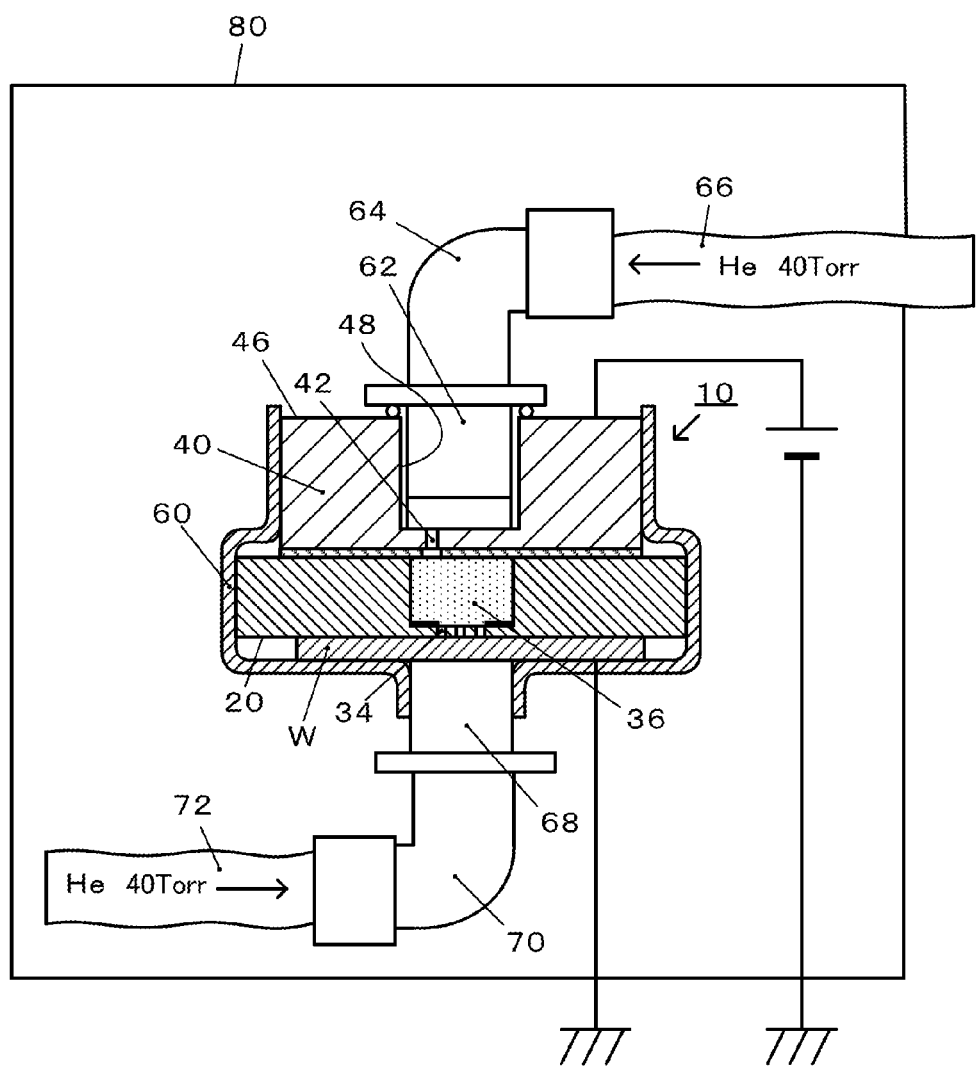
FIG. 5 illustrates an apparatus for measuring a withstand voltage.

For each of the examples 1 to 3 and the comparative examples 1 to 3, three samples were made, and the withstand voltages (kV) of these samples were measured. Tables 1 and 2 show the results of the measurement. A DC voltage was applied between the wafer W and the cooling device 40, and the withstand voltage, at which arc discharge between the wafer W and the cooling device 40 occurred, was measured. FIG. 5 illustrates a measurement device that was used for the measurement. In FIG. 5, the example 1 of the semiconductor manufacturing apparatus member 10 is illustrated. The measurement device was assembled in an acrylic box 80. To be specific, the semiconductor manufacturing apparatus member 10 and a wafer W placed on the wafer placement surface 22, excluding the surface 46 of the cooling device 40 and a central portion of the wafer W, were covered with a heat-shrinkable tube 60; a pipe 62 was inserted into an attachment hole 48 in the cooling device 40; and a pipe 68 was attached to the wafer W. The attachment hole 48 is a hole that is connected to the gas supply hole 42. The pipe 62 was attached to the cooling device 40 so as to be airtight by using a packing. A metal joint 64 and a fluoropolymer tube 66 were connected to the pipe 62, and He gas having a pressure of 40 Torr was supplied to the pipe 62. The pipe 68 was attached to the wafer W so as to be airtight by using the heat-shrinkable tube 60. A metal joint 70 and a fluoropolymer tube 72 were connected to the pipe 68, and He gas having a pressure of 40 Torr was supplied to the pipe 68.

The withstand voltage of each of the examples 1 to 3 was higher than that of the comparative example 1, because the dimension C (distance between the narrow hole and the gas supply hole) was larger than the dimension B (the thickness of the air permeable plug 36) and the dimension (D+E) (the sum of the length of the adhesive-layer-side portion R2a and the length of the sheet-side portion R2b) was larger than the dimension B. The withstand voltage of each of the comparative examples 2 and 3 was lower than or equal to that of the comparative example 1, because the dimension (D+E) was smaller than the dimension B although the dimension C was larger than the dimension B.

The present application claims priority from U.S. Provisional Application No. 61/639,207 filed on Apr. 27, 2012, the entire contents of which are incorporated herein by reference.

INDUSTRIAL APPLICABILITY

The present invention is applicable to a semiconductor manufacturing apparatus member, such as a susceptor, an electrostatic chuck, or a ceramic heater, which supports a wafer.

What is claimed is:

1. A semiconductor manufacturing apparatus member in which an electrostatic chuck having a wafer placement surface is disposed on a cooling device, the member comprising:
   a gas supply hole that extends through the cooling device from a joint surface of the cooling device that is joined to the electrostatic chuck to a surface of the cooling device that is opposite to the joint surface;
   an insulating bonding sheet that is disposed between the electrostatic chuck and the cooling device and has a through hole at a position facing the gas supply hole;
   a recessed portion that is formed in the electrostatic chuck from a surface of the electrostatic chuck that faces the gas supply hole toward the wafer placement surface, the recessed portion being connected to the gas supply hole;
   a narrow hole that extends through the electrostatic chuck from a bottom surface of the recessed portion to the wafer placement surface;
   an air permeable plug that is made of an insulating material and is fitted into the recessed portion; and
   an insulating adhesive layer that is disposed between the bottom surface of the recessed portion and the air permeable plug and has a through hole at a position facing the narrow hole,
   wherein the shortest distance from the narrow hole to the gas supply hole across the air permeable plug is larger than a thickness of the air permeable plug, and
   wherein the sum of the shortest distance from an edge of the through hole in the adhesive layer to an outer peripheral surface of the air permeable plug along the adhesive layer and the shortest distance from the outer peripheral surface of the air permeable plug to an edge of the through hole in the bonding sheet along the bonding sheet is also larger than the thickness of the air permeable plug.

2. The semiconductor manufacturing apparatus member according to claim 1, wherein the narrow hole is provided in a plurality, the through hole in the adhesive layer is formed at a position facing the plurality of narrow holes, and the shortest distance from one of the narrow holes that is nearest to the gas supply hole to the gas supply hole across the air permeable plug is larger than the thickness of the air permeable plug.

3. The semiconductor manufacturing apparatus member according to claim 2, wherein the plurality of narrow holes are formed in a circular region having a predetermined radius from the center of the recessed portion.

* * * * *